(12) United States Patent
Mauder et al.

(10) Patent No.: US 11,069,626 B2
(45) Date of Patent: Jul. 20, 2021

(54) MOLDING COMPOUND AND SEMICONDUCTOR PACKAGE WITH A MOLDING COMPOUND

(71) Applicant: Infineon Technologies AG, Neubiberg (DE)

(72) Inventors: Anton Mauder, Kolbermoor (DE); Oliver Hellmund, Neubiberg (DE); Peter Irsigler, Obernberg/Inn (AT); Hanno Melzner, Putzbrunn (DE); Stefan Miethaner, Regensburg (DE); Sebastian Schmidt, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 49 days.

(21) Appl. No.: 16/385,337

(22) Filed: Apr. 16, 2019

(65) Prior Publication Data
US 2019/0318996 A1 Oct. 17, 2019

(30) Foreign Application Priority Data
Apr. 17, 2018 (DE) .......................... 102018109013.7

(51) Int. Cl.
*H01L 23/552* (2006.01)
*H01L 23/31* (2006.01)
(Continued)

(52) U.S. Cl.
CPC .......... *H01L 23/552* (2013.01); *H01L 23/295* (2013.01); *H01L 23/3135* (2013.01); *H01L 23/49562* (2013.01); *H01L 23/49844* (2013.01); *H01L 23/562* (2013.01); *H01L 24/48* (2013.01); *H01L 25/072* (2013.01); *H01L 2224/48227* (2013.01); *H01L 2224/48245* (2013.01);
(Continued)

(58) Field of Classification Search
CPC ........... H01L 23/552; H01L 2924/3025; H01L 23/3135; H01L 23/49838; H01L 2224/92247; H01L 23/5389; H01L 2224/05548; H01L 23/3107; H01L 2224/45572; H01L 23/3114; H01L 2224/02379; H01L 23/49833; H01L 23/522; H01L 27/0248; H01L 2924/18161; H01L 2924/18162; H01L 2224/83951; H01L 23/28; H01L 23/31
USPC ........................................................ 257/659
See application file for complete search history.

(56) References Cited

U.S. PATENT DOCUMENTS

2008/0142932 A1* 6/2008 Beer ........................ H01L 23/29
257/659
2009/0236563 A1 9/2009 Goan et al.
(Continued)

FOREIGN PATENT DOCUMENTS

CN 107141719 A 9/2017
DE 102010005020 A1 9/2011

*Primary Examiner* — Theresa T Doan
(74) *Attorney, Agent, or Firm* — Murphy, Bilak & Homiller, PLLC

(57) ABSTRACT

A molding compound and a semiconductor arrangement with a molding compound are disclosed. The molding compound includes a matrix and a filler including filler particles. The filler particles each include a core with an electrically conducting or a semiconducting material and an electrically insulating cover.

20 Claims, 3 Drawing Sheets

(51) Int. Cl.
    *H01L 23/495*     (2006.01)
    *H01L 23/498*     (2006.01)
    *H01L 23/00*     (2006.01)
    *H01L 25/07*     (2006.01)
    *H01L 23/29*     (2006.01)

(52) U.S. Cl.
    CPC ............ *H01L 2924/10253* (2013.01); *H01L 2924/10272* (2013.01); *H01L 2924/13091* (2013.01); *H01L 2924/3025* (2013.01); *H01L 2924/351* (2013.01)

(56) References Cited

U.S. PATENT DOCUMENTS

| | | | |
|---|---|---|---|
| 2010/0040803 A1* | 2/2010 | Kim | C01B 33/035 427/588 |
| 2012/0326339 A1* | 12/2012 | Suzuya | H01L 21/565 257/787 |
| 2013/0169277 A1* | 7/2013 | Huber | G01R 33/385 324/322 |
| 2015/0291778 A1 | 10/2015 | Musick et al. | |
| 2017/0338164 A1* | 11/2017 | Koerner | H01L 23/49582 |
| 2018/0254286 A1* | 9/2018 | Lee | H01L 29/518 |

\* cited by examiner

MOLDING COMPOUND AND SEMICONDUCTOR PACKAGE WITH A MOLDING COMPOUND

TECHNICAL FIELD

This disclosure in general relates to a molding compound and a semiconductor arrangement including a package with a molding compound.

BACKGROUND

Molding compounds are the plastics used to encapsulate semiconductor dies in which, for example, discrete semiconductor devices or integrated circuits with a plurality of integrated devices are integrated. Usually, molding compounds are composite materials including a matrix material such as an epoxy or silicone, and a filler such as silica as the main components.

A molding compound can be molded and cured to a solid shaped package. In this solid state, it protects the encapsulated semiconductor from all sorts of potential damages and provides for an electrical insulation.

A package consisting of cured molding compound may include mobile or fixed charge carriers such as ions or charged molecules as impurities. Such impurities can be included in the molding compound right from the beginning, can result from the manufacturing process, or can diffuse into the package over the time. Examples of such impurities include hydroxide ions ($OH^-$) or sodium ions ($Na^+$). Some types of semiconductor dies, during operation, may cause an electric field in the package. In particular, semiconductor dies in which power semiconductor devices, such as diodes or transistors, are integrated may cause electric fields with high field strengths in the package. Such electric field may cause charged impurities to move in the package and to accumulate at certain positions inside the package. Such accumulation of charged impurities may negatively affect operation of the device integrated in the die. In particular, such charged impurities may reduce a voltage blocking capability of the device and enhance a leakage current.

SUMMARY

There is a need for a molding compound that reduces or avoids an accumulation of charged impurities in the package.

One example relates to a molding compound. The molding compound includes a matrix and a filler including filler particles, wherein the filler particles each include a core with an electrically conducting or a semiconducting material and an electrically insulating cover.

Another example relates to a semiconductor arrangement with at least one semiconductor die and a molding compound of the type explained before.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and, for the purpose of illustration, show examples of how the invention may be used and implemented. It is to be understood that the features of the various embodiments described herein may be combined with each other, unless specifically noted otherwise.

Figure 1A:
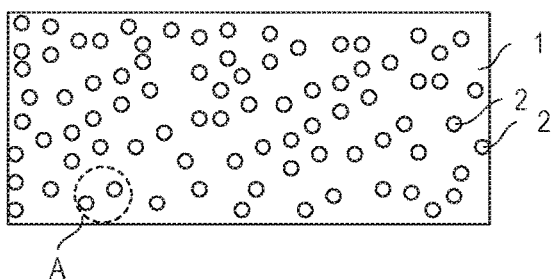
FIGS. 1A and 1B illustrate one example of a molding compound that includes a matrix and a filler with filler particles.
Figure 1B:
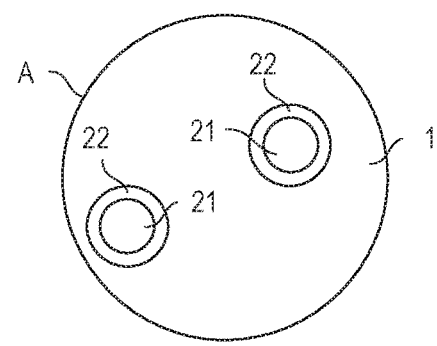

FIGS. 1A and 1B illustrate one example of a molding compound. FIG. 1A shows a vertical cross sectional view of one section of the molding compound and FIG. 1B shows an enlarged detail A of the molding compound shown in FIG. 1A. Referring to FIGS. 1A and 1B, the molding compound includes a matrix 1 and a filler with a plurality of filler particles 2 embedded in the matrix 1 and surrounded by the matrix 1. Referring to FIG. 1B, each of the filler particles 2, which are briefly referred to as particles 2 in the following, includes a core 21 and a cover 22 enclosing the core 21. The core 21 includes an electrically conducting material or a semiconducting material, and the cover 22 includes an electrically insulating material.

According to one example, the molding compound includes at least 10 percent by weight (wt. %), at least 30 wt. % or even at least 50 wt. % of the filler. That is, at least 10%, at least 30% or at least 50% of the weight of the molding compound results from the weight of the filler particles 2. In particular, the molding compound may comprise between 60 wt. % and 90 wt. % of the filler.

According to one example, the matrix 1 includes an epoxy resin. Based on a molding compound including an epoxy resin, semiconductor packages can be formed by heating the molding compound such that the epoxy resin flows, introducing the molding compound into a mold, curing the molding compound, and removing the package made from the molding compound from the mold. Additionally to the matrix 1 and the filler particles 2, the molding compound may include at least one of a catalyst that accelerates curing of the molding compound, and a release agent that promotes releasing the cured molding compound from the mold. Additionally, the molding compound may include a colorant (pigment). According to one example, a portion of each of these additional components in the molding compound is less than 3 wt. %.

Additionally, the molding compound may include electrically insulating and thermally conducting particles such as particles made from diamond, tungsten carbide, other carbides, aluminum nitride, silicon nitride or electrically insulating silicon carbide (SiC). Such particles can help to reduce a thermal resistance of the molding compound.

According to another example, the matrix 1 includes silicone. A silicone based molding compound may cure by bringing the molding compound in contact with air or by employing a furnace process.

According to one example, the core 21 includes a semiconductor material and the cover 22 includes a semiconductor oxide. Examples of the semiconductor material include, but are not restricted to, silicon (Si) and silicon carbide (SiC). Particles 2 with a core 21 comprised of silicon or silicon carbide may include a cover 22 comprised of silicon oxide ($SiO_2$). According to one example, the core 21 includes a doped semiconductor material in order to enhance a conductivity of the core. The doping type can be an n-type or a p-type. According to one example, the doping concentration is higher than $1E18$ $cm^{-3}$, higher then $1E19$ $cm^{-3}$, or higher than $1E21$ $cm^{-3}$.

According to one example, "electrically insulating silicon carbide" particles, as mentioned above, that may be used as electrically insulating and thermally conducting particles, are SiC particles which are undoped or which have a doping concentration lower than $1E14$ $cm^{-3}$.

According to another example, the core 21 includes a metal and the cover 22 includes a corresponding metal oxide. Examples of the metal include, but are not restricted to, aluminum (Al), magnesium (Mg), nickel (Ni), zinc (Zn), or titanium (Ti).

The filler particles can be formed by providing semiconductor particles or metal particles and by oxidizing surfaces of these particles in an oxidizing atmosphere in a temperature process. Particles with a silicon core 21 and a silicon oxide cover 22 can be formed, for example, by (a) grinding monocrystalline or polycrystalline silicon into particles of a desired size, and (b) oxidizing the surfaces of the semiconductor particles resulting from the grinding process in a temperature process in an oxidizing atmosphere.

According to one example, the filler particles are selected such that their size is between 10 micrometers (μm) and 100 micrometers. The "size" of one particle is the average diameter d of one particle, which is given by $$d = \sqrt[3]{\frac{3V}{\pi}} \quad (1)$$

where d is the average diameter and V is the volume of the particle 2. Just for the purpose of illustration, in FIGS. 1A and 1B, the particles 2 are drawn to have the shape of balls. This, however, is just for the purpose of illustration. The particles 2 can be formed to have any other shape as well.

According to one example, the particles 2 have essentially the same size. According to another example, the particles 2 include two or more groups of particles, wherein the particles of one group essentially have the same size. "The same size" means that the size of the particles is within $0.9 \cdot d_i$ and $1.1 \cdot d_i$, wherein $d_i$ is the desired size of the particles of the respective group.

According to one example, a thickness of the cover 22 is between 2 nanometers (nm) and 400 nanometers. The "thickness" of the cover is the dimension of the cover in a direction perpendicular to a surface of the cover 22 or perpendicular to an interface between the cover 22 and the core 21.

According to one example, a thickness of the cover 22 is adapted to the average diameter of the particles such that a dielectric strength of the filler particles is greater than a dielectric strength of the matrix. This is explained by way of an example in the following. Assume that the matrix 1 is an epoxy resin with a dielectric strength of about 100 kV/cm and that the cover 22 is silicon dioxide with a dielectric strength of about 2 MV/cm, which is about 20 times the dielectric strength of the filler material. In order to achieve that the filler particles 2 do not degrade the dielectric strength of the molding compound, about 1/20 of diameter of the filler particles should be formed by the cover 22. This percentage increases as the dielectric strength of the cover material decreases relative to the dielectric strength of the matrix, and vice versa.

A package consisting of cured molding compound may include, as impurities, charge carriers such as ions or charged molecules. Such charge carriers can be included in the molding compound right from the beginning or can diffuse into the package 3 over the time. Examples of such impurities include hydroxide ions ($OH^-$) or sodium ions ($Na^+$). Such charge carriers, under the influence of an electric field, can move in the molding compound. In a conventional molding compound that includes electrically insulating filler particles such as fused silica particles, positive charged carriers may accumulate at a position close to the source of a negative potential causing the electric field, and negative charged carriers may accumulate close to a position of the source of a positive potential causing the electric field. Such accumulation of charge carriers may negatively affect a semiconductor device or an integrated circuit integrated in a semiconductor die encapsulated by the package.

Such accumulation of charge carriers at certain positions is avoided or at least reduced when using a molding compound of the type explained with reference to FIGS. 1A and 1B, that is, a molding compound that includes filler particles 2 with a conducting or semiconducting core 21 and an insulating cover 22. This is explained with reference to FIGS. 2A and 2B in the following.

Figure 2A:
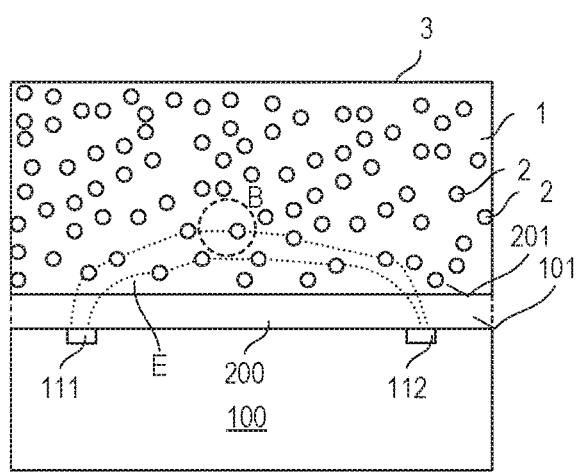
FIGS. 2A and 2B illustrate a vertical cross sectional view of a semiconductor arrangement including a package with molding compound and an enlarged view of a detail of the package.

FIG. 2A schematically illustrates a cross sectional view of one section of a semiconductor arrangement that includes a semiconductor die 100 and a package 3 including a molding compound of the type explained with reference to FIGS. 1A and 1B. In FIG. 2A, only one section of the semiconductor die 100 and one section of the package 3 with the molding compound is shown. More specifically, FIG. 2A shows one section of the semiconductor die 100 in a region close to a surface 101 of the semiconductor die and a section of the package 3 adjacent the surface. The package 3 may directly adjoin the surface 101 of the semiconductor die 100. Optionally, an insulation or passivation layer 200 is arranged between the surface 101 of the semiconductor die 100 and the package 3. The insulation or passivation layer 200 may include at least one of an oxide layer, a nitride layer, an imide layer, or the like. According to one example, the insulation or passivation layer 200 includes a layer stack with a plurality of different electrically insulating layers. According to one example, a wiring arrangement is embedded in the insulation or passivation layer 200. This wiring arrangement may connect semiconductor devices (not shown) integrated in the semiconductor die 100 with each other. Further, the wiring arrangement may include contact pads (not shown) at a surface 201 of the insulation or passivation layer 200, wherein these contact pads can be used to contact the one or more semiconductor devices integrated in the semiconductor die 100 from externally. Such wiring arrangements are known, so that no further explanations are required in this regard.

In FIG. 2A, reference characters 111 and 112 denote regions of the semiconductor die 100 that have different electrical potentials during operation of the semiconductor die 100. These regions 111, 112 can be doped semiconductor regions or metallizations. These regions 111, 112 can be two of a variety of regions that can have different electrical potentials in a semiconductor die 100. Examples of these regions 111, 112 include, but are not restricted to: field plates of an edge termination of a power semiconductor device; a source region and a drain region of a lateral power transistor device; a source region and a field plate of a vertical power transistor device, or the like.

Figure 2B:
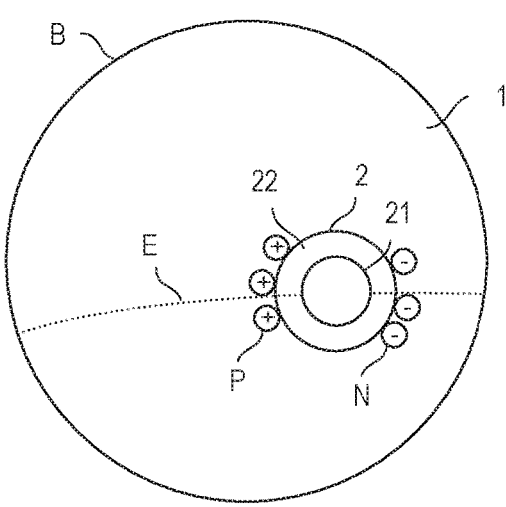

Due to the different electrical potentials of the regions 111, 112, there is an electric field between these regions 111, 112, wherein this electric field may extend into the package 3. Just for the purpose of illustration, field lines of the electric field in the package 3 are illustrated in doted lines in FIG. 2A. FIG. 2B is an enlarged view of a section B of the package 3 shown in FIG. 2A. Referring to FIG. 2B, which, for the purpose of illustration, shows only one field line of the electric field, the electric field does not go through the core 21 of the filler particle 2. This is due to the fact that the core 21 is made of an electrically conducting or semiconducting material. Due to the electric field, the core 21 has a certain electric potential. This potential is the same at every position of the core 21 and, therefore, at every position of an interface between the core 21 and the insulating cover 22. Referring to FIG. 2B, due to the electric field charged ions may reach the particle 2. Just for the purpose of illustration, some positively charged carriers P and some negatively charged carriers N are illustrated in FIG. 2B. Having reached the surface of the particle 2, there is no force that would further move the charge carriers P, N. This is due to the fact that the core 21 is free of an electric field. Thus, in the molding compound with the particles 2 having a conducting or semiconducting core 21 and an insulating cover 22, charge carriers P, N are somehow trapped at the individual particles 2. Due to the large number of particles 2 that are distributed over the molding compound trapped charge carriers are also distributed over the molding compound and do not accumulate in the molding compound close to positions of the first and second regions 111, 112 so that a locally enhanced electrical field can occur.

Figure 3:
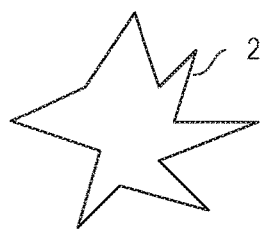
FIG. 3 schematically illustrates one example of a filler particle having a rough surface.

The trapping effect explained above can be improved by implementing the filler particles 2 with a rough surface that includes cavities. One example of a filler particle 2 with a rough surface is schematically illustrated in FIG. 3. Such rough or irregularly formed surface can be obtained when producing the filler particles 2 from a bigger piece of conducting or semiconducting material in a grinding process and oxidizing the particles obtained by the grinding process.

According to one example, the filler particles 2 include the same type of semiconductor material as the semiconductor die 100. The doping level of these materials, however, can be different. In this case, the molding compound, which is mainly comprised of the filler material, and the semiconductor die 100 essentially have the same thermal expansion coefficient. This may help to reduce thermal stress at an interface between the semiconductor die 100 and the molding compound. In this connection it should be noted that "semiconductor die" as used herein denotes an arrangement that includes a monocrystalline semiconductor body and may additionally include passivation layers, wiring arrangements inside the passivation layer and contact pads either directly on a surface of the monocrystalline semiconductor body or on a surface of the passivation layer. "The semiconductor material of the semiconductor die" is the semiconductor material of the monocrystalline semiconductor body included in the semiconductor die. According to one example, "the same type of semiconductor material" as mentioned above includes that the semiconductor die includes at least one of monocrystalline silicon (Si) or silicon carbide (SiC) and the core 21 of the filler particles 2 includes one of Si or SiC, wherein the core 21 can include monocrystalline or polycrystalline semiconductor material.

According to a further example, the thermal expansion coefficient of the filler particles 2 may be smaller than that of the semiconductor die 100 and the thermal expansion coefficient of other materials of the molding compound, such as the matrix 1, may have larger thermal expansion coefficients than that of the semiconductor die 100. In this case, the combination of the filler particles 2 and the matrix 1 in the molding compound may result in an average thermal expansion coefficient that is essentially equal to the thermal expansion coefficient of the semiconductor die 100. According to one example, the filler particles 2 include a silicon carbide (SiC) core 22 and the semiconductor die 100 includes monocrystalline silicon (Si), wherein SiC has a lower thermal coefficient than Si.

The molding compound explained above can be used to form various types of packages for encapsulating at least one semiconductor die. That is, the package 3 from which only one section is illustrated in FIG. 2A can have different forms. Some examples are explained with reference to FIGS. 4, 5 and 6A to 6B in the following.

Figure 4:
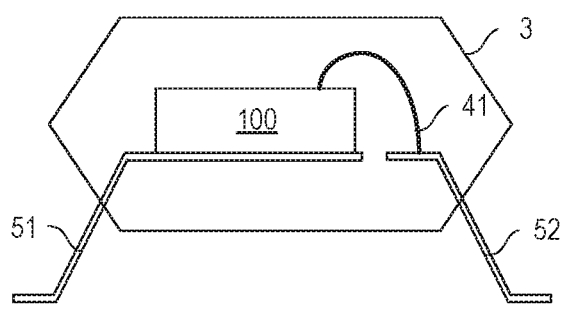
FIG. 4 shows a vertical cross sectional view of a semiconductor arrangement having a package made from a molding compound.

FIG. 4 shows a vertical cross sectional view of a semiconductor arrangement that includes a package 3 made from a molding compound of the type explained herein before. This package 3 encapsulates a semiconductor die 100. Further, the semiconductor arrangement includes legs 51, 52 protruding from the package 3 and electrically connected to the semiconductor die 100 inside the package 3. The legs 51, 52 can be connected to the semiconductor die 100 in various ways. Two different examples of how legs 51, 52 can be connected to the semiconductor die 100 are shown in FIG. 4. In the example shown in FIG. 4, one 51 of the legs 51, 52 is connected to the semiconductor die 100 in that a contact surface of the semiconductor die 100 is mounted to a section of the leg 51 arranged inside the package 3. Another one 52 of the legs is connected to the semiconductor die 100 using a bond wire 41. The bond wire 41 is connected between a contact pad of the leg 52 inside the package 3 and a contact pad of the semiconductor die 100. Contact pads of the semiconductor die 100 are not explicitly illustrated in FIG. 4. Although FIG. 4 only shows two legs 51, 52 of the semiconductor arrangement, it should be noted that a plurality of legs protruding from the package 3 and connected to different contact pads of the semiconductor die 100 can be included in the semiconductor arrangement.

Figure 5:
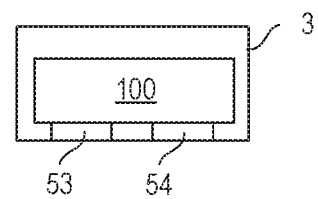
FIG. 5 shows a vertical cross sectional view of a semiconductor arrangement according to another example.

FIG. 5 illustrates another type of semiconductor arrangement having a semiconductor die 100 and a package 3. In this example, contact electrodes 53, 54 that are connected to contact pads of the semiconductor die 100 are accessible at a surface of the package 3. This type of arrangement can be referred to as SMD (surface mount device).

According to one example, semiconductor arrangements of the types shown in FIGS. 4 and 5, include only one semiconductor die 100. This, however, is only an example. According to another example (not shown) two or more semiconductor dies are encapsulated by a package 3 of one of the types shown in FIGS. 4 and 5. These semiconductor dies can be arranged next to each other in a so-called chip-by-chip configuration. According to another example, one of the two or more semiconductor dies is arranged on another one of the two or more semiconductor dies in a so-called chip-on-chip configuration. The matrix material of the package 3 according to FIGS. 4 and 5 is an epoxy resin, for example.

Figure 6A:
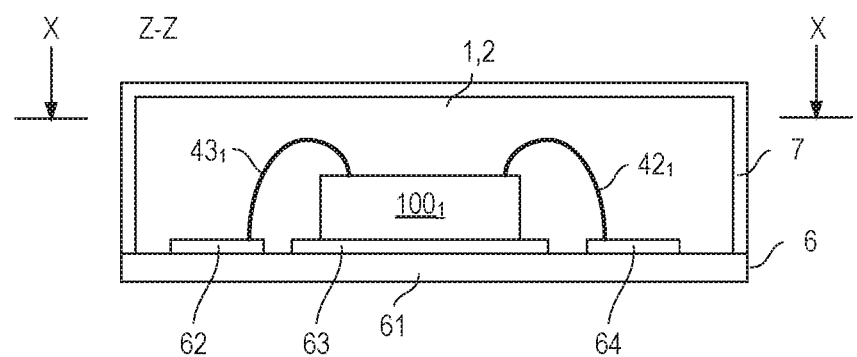
FIGS. 6A and 6B illustrate one example of a semiconductor arrangement including a plurality of semiconductor dies and a housing at least partially filled with a molding compound.
Figure 6B:
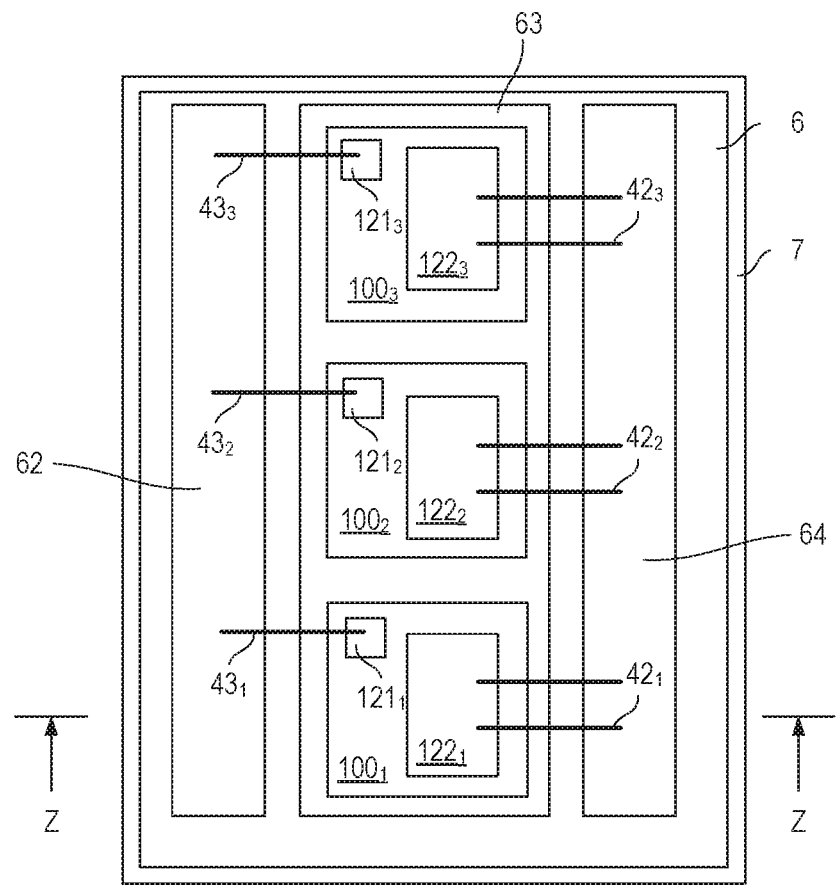

FIGS. 6A and 6B show a semiconductor arrangement according to another example. In this example, the semiconductor arrangement includes a housing 6, 7 in which a plurality of semiconductor dies $100_1$-$100_3$ are arranged. A space between the semiconductor dies $100_1$-$100_3$ and the housing 7 is at least partially filled by a molding compound 1, 2 of the type explained herein before. According to one example, a matrix material is silicone in this example. In the example illustrated in FIGS. 6A and 6B, the housing includes a substrate 6 and a cover 7. Contact pins protruding from the housing 6, 7 and connected to the dies $100_1$-$100_3$ inside the housing are not shown in FIGS. 6A and 6B. In this example, a package of the semiconductor arrangement is formed by the housing 6, 7 and the molding compound inside the housing 6, 7.

Referring to FIGS. 6A and 6B, the semiconductor dies $100_1$-$100_3$ are mounted to a first contact pad 63 of the substrate 6. According to one example, the substrate 6 is a DCB (direct copper bonding) substrate and includes an electrically insulating carrier 61 and several contact pads 62, 63, 64 (three in the example shown in FIGS. 6A and 6B) on the carrier 61. According to one example, the carrier 61 is made of a ceramic and the contact pads include copper. According to one example, the semiconductor dies $100_1$-$100_3$ are not only mounted to the first contact pad 63 but are also electrically connected to the contact pad 63.

Referring to FIGS. 6A and 6B, the semiconductor dies $100_1$-$100_3$ may include further contact pads $121_1$-$121_3$, $122_1$-$122_3$ at a respective surface of the dies $100_1$-$100_3$ facing away from the first contact pad 63. These further contact pads $121_1$-$121_3$, $122_1$-$122_3$ of the dies $100_1$-$100_3$ can be connected to a second and third contact pad 62, 64 of the substrate 6 by bond wires $43_1$-$43_3$, $42_1$-$42_3$ (as shown), flat conductors, or the like.

According to one example, vertical power transistors are integrated in the semiconductor dies $100_1$-$100_3$, wherein a drain node of the respective power transistor is formed at those surfaces of the semiconductor dies $100_1$-$100_3$ connected to the first contact pad 63, source nodes are formed by the contact pads $122_1$-$122_3$ and the gate nodes are formed by the other contact pads $121_1$-$121_3$.

In the example illustrated in FIGS. 6A and 6B, the substrate 6 forms a part of the housing. This, however, is only an example. According to another example, not shown, the substrate with the dies is embedded in the housing.

Although the present disclosure is not so limited, the following numbered examples demonstrate one or more aspects of the disclosure.

Example 1

A molding compound, including: a matrix; and a filler including filler particles (2), wherein the filler particles each include a core including an electrically conducting or a semiconducting material and an electrically insulating cover.

Example 2

The molding compound of example 1, wherein the core includes one of silicon and silicon carbide, and wherein the cover includes silicon oxide.

Example 3

The molding compound of any combination of example 1 to 2, wherein the semiconducting material is a doped semiconducting material.

Example 4

The molding compound of any combination of example 1 to 3, wherein a doping concentration of the doped semiconducting material is greater than 1E18 $cm^{-3}$.

Example 5

The molding compound of any combination of example 1 to 4, wherein the core includes a metal, and wherein the cover includes a metal oxide.

Example 6

The molding compound of any combination of example 1 to 5, wherein the molding compound includes at least 10 wt. % of the filler.

Example 7

The molding compound of any combination of example 1 to 6, wherein the molding compound includes between 60 wt. % and 90 wt. % of the filler.

Example 8

The molding compound of any combination of example 1 to 7, wherein a particle size of the filling particles is between 10 micrometers and 100 micrometers.

Example 9

The molding compound of any combination of example 1 to 8, wherein a thickness of the cover is between 2 nanometers and 400 nanometers.

Example 10

The molding compound of any combination of example 1 to 9, wherein the cover has a rough surface.

Example 11

The molding compound of any combination of example 1 to 10, wherein the matrix includes one of an epoxy and silicone.

Example 12

The molding compound of any combination of example 1 to 11, further including at least one of a catalyst, a mold release material, and a colorant.

Example 13

A semiconductor arrangement including: at least one semiconductor die; and a molding compound according to any combination of examples 1 to 12.

Example 14

The semiconductor arrangement of example 13, wherein the semiconductor die includes at least one of monocrystalline silicon (Si) and monocrystalline silicon carbide (SiC).

Example 15

The semiconductor arrangement of any combination of example 12 to 14, further including: a carrier, wherein the at least one semiconductor die is mounted to the carrier.

Example 16

The semiconductor arrangement of any combination of example 12 to 15, wherein the semiconductor arrangement includes a plurality of semiconductor dies mounted to the carrier.

Example 17

The semiconductor arrangement of any combination of example 12 to 16, wherein molding compound forms a package of the semiconductor arrangement.

Example 18

The semiconductor arrangement of any combination of example 12 to 17, further including: a housing, wherein the molding compound at least partially fills the housing.

While the invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A molding compound, comprising:
   a matrix; and
   a filler comprising filler particles,
   wherein the filler particles each comprise a core comprising a semiconducting material and an electrically insulating cover,
   wherein the core comprises one of: a doped monocrystalline silicon particle, and a silicon carbide particle.

2. The molding compound of claim 1, wherein a doping concentration of the doped semiconducting material is greater than 1E18 $cm^{-3}$.

3. The molding compound of claim 1, wherein the molding compound comprises at least 10 wt. % of the filler.

4. The molding compound of claim 3, wherein the molding compound comprises between 60 wt. % and 90 wt. % of the filler.

5. The molding compound of claim 3, wherein a thickness of the cover is between 2 nanometers and 400 nanometers.

6. The molding compound of claim 1, wherein a particle size of the filling particles is between 10 micrometers and 100 micrometers.

7. The molding compound of claim 1, wherein the matrix comprises one of an epoxy and silicone.

8. The molding compound of claim 1, further comprising at least one of a catalyst, a mold release material, and a colorant.

9. A semiconductor arrangement comprising:
   at least one semiconductor die comprising a semiconductor material; and
   a molding compound according to claim 1.

10. The semiconductor arrangement of claim 9, wherein the filler particles comprise the same type of semiconductor material as the semiconductor die.

11. The semiconductor arrangement of claim 10, wherein the at least one semiconductor die comprises at least one of monocrystalline silicon (Si) and monocrystalline silicon carbide (SiC).

12. The semiconductor arrangement of claim 9, further comprising:
   a carrier,
   wherein the at least one semiconductor die is mounted to the carrier.

13. The semiconductor arrangement of claim 12, wherein the semiconductor arrangement comprises a plurality of semiconductor dies mounted to the carrier.

14. The semiconductor arrangement of claim 9, wherein the molding compound forms a package of the semiconductor arrangement.

15. The semiconductor arrangement of claim 9, further comprising:
   a housing,
   wherein the molding compound at least partially fills the housing.

16. The molding compound of claim 1, wherein the core comprises the doped monocrystalline silicon particle.

17. The molding compound of claim 1, wherein the core comprises the silicon carbide particle, and wherein the silicon carbide particle has a doping concentration of higher than 1E18 $cm^{-3}$.

18. The molding compound of claim 1, wherein the core comprises the silicon carbide particle, and wherein the silicon carbide particle has a doping concentration of lower than 1E14 $cm^{-3}$.

19. A molding compound, comprising:
   a matrix; and
   a filler comprising filler particles,
   wherein the filler particles each comprise a core comprising a semiconducting material and an electrically insulating cover,
   wherein the cover has a rough surface.

20. A molding compound, comprising:
   a matrix; and
   a filler comprising filler particles,
   wherein the filler particles each comprise a metal core and an electrically insulating cover,
   wherein the metal core is a particle of one of the following: aluminum (Al), magnesium (Mg), nickel (Ni), zinc (Zn), or titanium (Ti), and
   wherein the electrically insulating cover comprises a metal oxide of the metal from the metal core.

* * * * *